United States Patent [19]
Slawson et al.

[11] Patent Number: 5,268,916
[45] Date of Patent: Dec. 7, 1993

[54] LASER BIAS AND MODULATION CIRCUIT

[75] Inventors: Michael R. Slawson, Raleigh; James J. Stiscia, Garner, both of N.C.

[73] Assignee: Alcatel Network Systems, Inc., Richardson, Tex.

[21] Appl. No.: 898,702

[22] Filed: Jun. 15, 1992

[51] Int. Cl.[5] .......................... H01S 3/00; H01S 3/10
[52] U.S. Cl. ........................................ 372/38; 372/26; 372/29
[58] Field of Search .................... 372/26, 29, 38, 31, 372/32, 33, 34

[56] References Cited

U.S. PATENT DOCUMENTS

| | | | |
|---|---|---|---|
| 4,385,387 | 5/1983 | Trimmel | 372/29 |
| 4,916,706 | 4/1990 | Ohashi | 372/38 |
| 4,967,417 | 10/1990 | Yamada | 372/29 |
| 5,018,154 | 5/1991 | Ohashi | 372/29 |
| 5,144,631 | 9/1992 | Okino | 372/38 |

Primary Examiner—Georgia Y. Epps
Attorney, Agent, or Firm—Ware, Fressola, Van Der Sluys & Adolphson

[57] ABSTRACT

Constant light output is provided by a laser diode over various temperatures or operating points by adjusting the bias current in accordance with a midpoint of a detected peak and a detected valley of an output power level and adjusting the modulation current amplitude in accordance with the difference between the detected peak and the detected valley output power.

17 Claims, 6 Drawing Sheets

LASER BIAS AND MODULATION CIRCUIT

TECHNICAL FIELD

This invention relates to the transmission of information on optical fibers and, more particularly, to a control circuit for controlling a laser for providing optical signals to an optical fiber.

BACKGROUND OF THE INVENTION

Laser diodes are commonly used to provide optical signals to optical fibers for transmission thereon. Typically, the laser diode will be biased at some selected bias current level, and the diode will then be intensity-modulated about that bias point at a modulation level necessary to achieve a desired light output level. Unfortunately, laser characteristics change in two important ways when operated over a wide temperature range. First, the lasing threshold tends to increase with increasing temperature. This implies that, to maintain a constant average optical output power with an increase in temperature, average drive current, often called bias current, must be increased. Second, the efficiency of the laser current-to-optical power conversion (known as slope efficiency) decreases with increasing temperature.

One implication of the second effect, i.e., the slope efficiency decreasing with increasing temperature, is the same as the first: to maintain at a constant average optical output power with increasing temperature, bias current must be increased. Another implication of the second effect is that, to maintain a constant signal, or modulation, optical output power with increasing temperature, modulation current must be increased.

In order to obtain reliable and repeatable results in many fiber optic transmission applications, both average and signal power out of the laser must be held relatively constant. Many times this problem is skirted through the use of thermo-electric cooling to maintain the laser at a relatively constant temperature. This solution is generally costly, power consumptive, and usually unacceptable for high-volume, low-cost applications. Another possible solution has been to simply monitor the laser temperature and adjust the bias and signal current levels according to expected performance curves. However, for low-cost lasers, the change in characteristics with temperature is usually not accurately predictable from device to device. This mandates that either each laser be individually characterized over temperature, or that a feedback loop be established to control the laser in operation. Individual characterization, besides being expensive, has the additional disadvantage of not accounting for any changes in laser characteristics that may occur as the laser ages.

A feedback loop can be established through the laser's own back facet monitor photodiode, or through the whole link and the receiver at the opposite end. The latter approach has the advantage of being able to accommodate changes in the cable plant, the receiver, and the laser-to-fiber coupling. It has the disadvantage of requiring the addition of control circuitry at the receiver and a link back to the transmitter. If the feedback link is already present, as it would be for a fiber-to-the-curb application, such as disclosed in U.S. patent application Ser. No.07/739,203, entitled "Fiber Optic Link", filed Jul. 30, 1991, now abandoned, capacity may be used for feedback information. However, the possibility that feedback information may not arrive back to the laser in a timely fashion, causing instability in the laser performance, must also be considered.

Localized feedback through the back facet monitor is commonly used to regulate the bias current of the laser. Slope efficiency variations, which are as high as 6 dB, are often ignored. In some cases, through the generation and addition of a fixed level 'pilot' carrier to the signal, modulation current is also regulated through the back facet monitor diode. However, circuitry must be added to generate the pilot carrier and a multiplexer with the signal. Additionally, link bandwidth is taken up by the pilot.

DISCLOSURE OF INVENTION

The object of the present invention is to regulate a laser.

According to the present invention, constant light output from a laser diode over various temperatures is achieved by adjusting the bias current in accordance with a first set of parameters and adjusting the modulation current amplitude in accordance with a second set of parameters.

In further accord with the present invention, constant light output over various modulation coding schemes from a laser diode is achieved by adjusting the bias current in accordance with a first set of parameters and adjusting the modulation current amplitude in accordance with a second set of parameters.

In still further accord with the present invention, the first set of parameters may comprise an average of detected peak and valley amplitudes of the light output from the laser diode.

In still further accord with the present invention, the second set of parameters may comprise a difference between the peak and valley of the light output from the laser diode.

This invention was first conceived as a way to regulate a low-cost, uncooled laser, which was intended to be modulated with a frequency multiplexed hybrid signal consisting of a relatively low speed (less than 50 megabaud) digital signal and a high-speed (up to 1 gigahertz) analog composite video signal. The application for the invention was in a fiber-to-the-curb system, such as disclosed in the above-referenced copending U.S. patent application Ser. No. 07/739,203, now abandoned where wide temperature ranges must be handled by low-cost designs, and where the transmitted signal is a hybrid analog video/digital voice signal.

Thus, the present invention provides a way to use the already-present digital signal in an all-digital or all-hybrid digital/analog application as a virtual pilot. We also teach a technique for using the digital signal such that most non-balanced coding schemes and data-dependent DC-based line wandering in the digital signal will not incorrectly affect the laser bias and modulation currents.

These and other objects, features and advantages of the present invention will become more apparent in light of the following detailed description of a best mode embodiment thereof, as illustrated in the accompanying drawings.

BRIEF DESCRIPTION OF THE DRAWINGS

FIG. 2(a) and 2(b) together show a block diagram of a circuit, according to the present invention, for automatic bias and modulation control for a hybrid digital-/analog application according to the present invention.

FIGS. 5(a) and 5(b) together are a detailed illustration of one way to carry out the bias and automatic gain control circuitry of FIGS. 2(a) and 2(b).

BEST MODE FOR CARRYING OUT THE INVENTION

Figure 1:
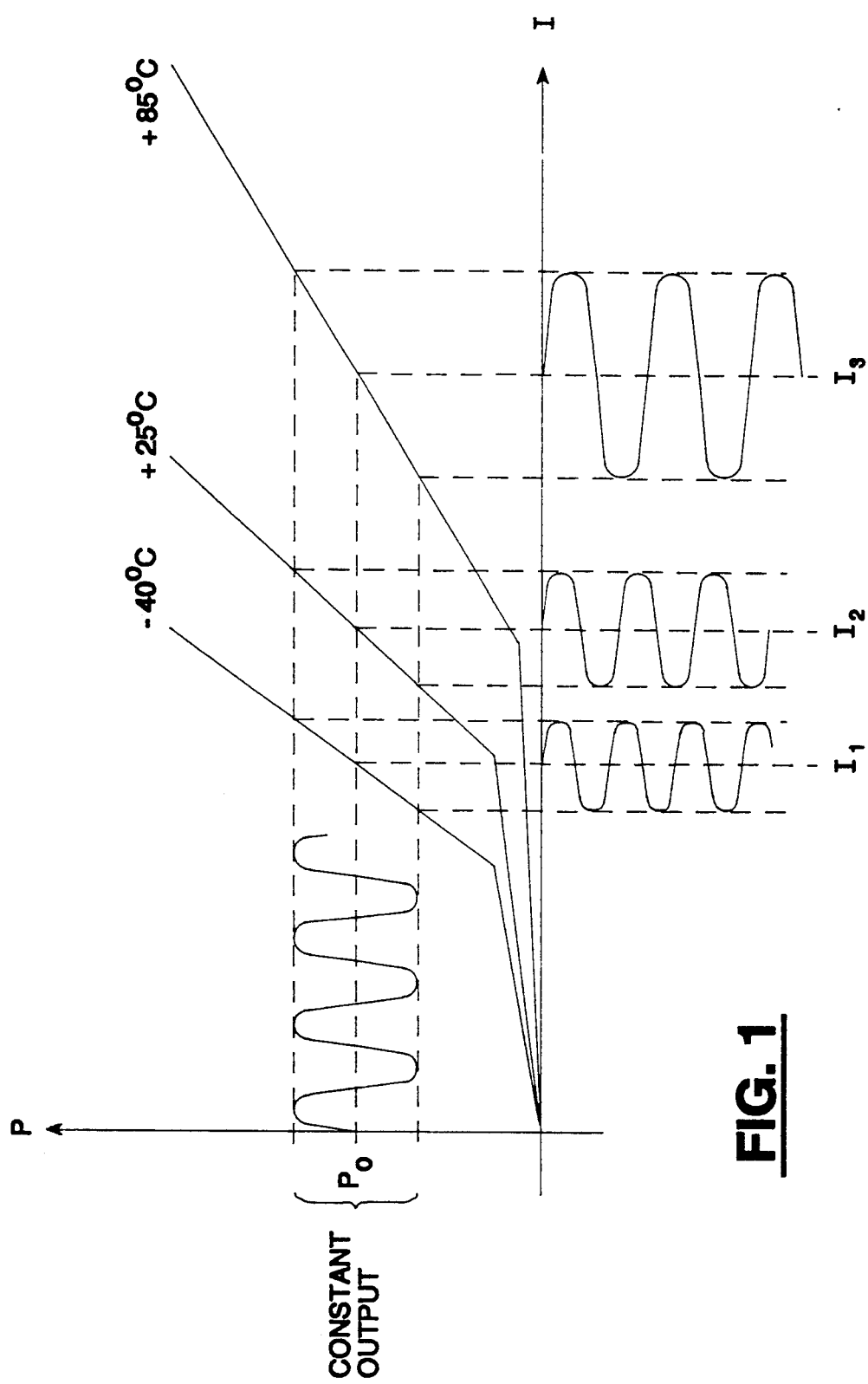
FIG. 1 shows laser bias and modulation amplitude varied in order to achieve constant output power, according to the present invention.

FIG. 1 shows that a constant output power may be achieved for varying efficiencies or operating points of a laser diode modulated by a modulating signal by controlling the bias point and the amplitude of the modulation. In the case of varying efficiencies as caused, for example, by varying temperatures, the present invention automatically compensates by varying the operating point and the amplitude of modulation. This is shown for three different temperatures, resulting in three different operating points and amplitudes of the modulating signal. In the case of varying operation points which could be caused, for example, by a digital modulating signal without a 50 percent duty cycle, though the operating point would have a tendency to deviate to some extent (as in the prior art) to the left or right of one of the operating points ($I_1, I_2, I_3$) as shown in FIG. 1, according to the present invention, the operating point is made to the same.

Figure 2A:
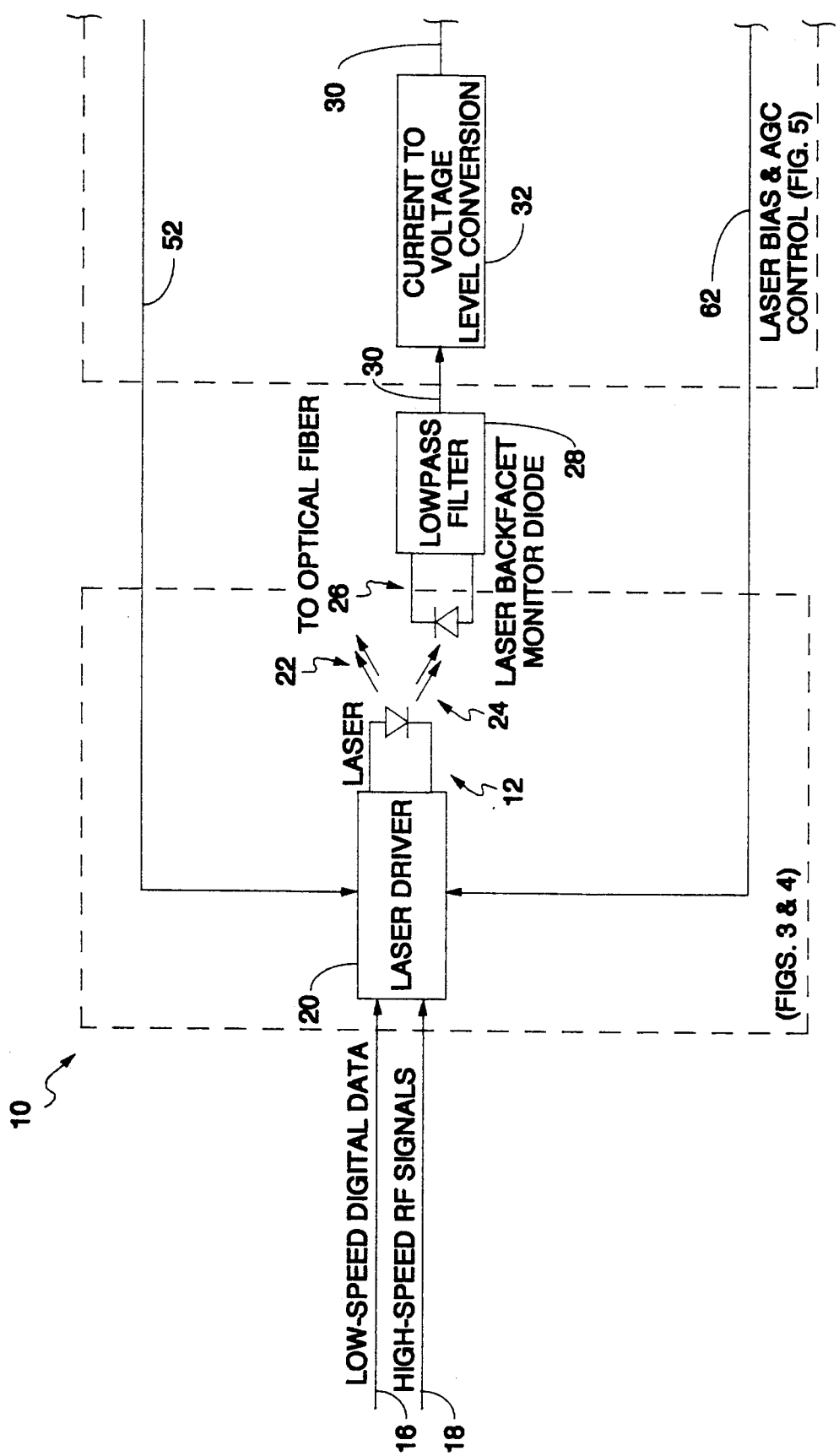

FIGS. 2(a) and 2(b) show an embodiment of the present invention which includes a feedback circuit 10 used to regulate a low-cost, uncooled laser 12, which is being modulated by a frequency-division multiplexed signal 14 which is shown before being multiplexed within a driver 20 as two separate signals on a pair of lines 16, 18. The components 16, 18 of the signal 14 may comprise a relatively low-speed digital data signal (for example, at less than 50 megabaud) and one or more high-speed RF signals such as analog television channels (spaced along the frequency spectrum up to 1 gigahertz, for example). The laser driver circuit 20 is responsive to the signals on the lines 16, 18, multiplexes the signals 16, 18 into the frequency-division multiplexed signal 14 and provides drive current for the laser 12, which in turn provides light output 22 to an optical fiber (not shown) for transmission thereon. The laser driver modulates the laser around a bias current level and transmits light 22 into the optical fiber through its front facet and also transmits light 24 into a monitor photodiode 26 through its back facet. The frequency response of the monitor diode is generally slow enough to block the analog video signals, but fast enough to pass the digital signal. However, if the analog video signals are not significantly attenuated at the monitor diode, then a lowpass filter 28 may be inserted in the signal path to filter them out. In any event, either the laser back facet monitor diode 26 or the lowpass filter, or both, will provide a filtered low-frequency signal on a line 30 to a current-to-voltage level converter 32, which may be nothing more than a resistor network to a reference to provide a voltage on the same line 30 to a voltage peak-to-peak detector 36a, 36b.

The peak and valley detection circuits 36a, 36b, respectively, where the highest and lowest absolute voltage levels found in the converted signals are held and provided on lines 38a, 38b, respectively. The response and hold times of the peak and valley detectors are set depending upon the symbol rate of the digital data and the longest duration between transitions. It should be realized that true non-return-to-zero (NRZ) encoding, where the time between symbol transitions can be extremely long, cannot be used with the embodiment disclosed herein.

After peak and valley detection, the control voltages on the lines 38a, 38b are provided to an averager 40 and a difference detector 42. In the averager, the peak and valley voltages 38a, 38b are averaged to find the midpoint, and a midpoint signal having a magnitude indicative thereof is provided on a line 44 to a laser bias control 46. Because peak and valley voltages are used to determine the midpoint, instead of performing average level detection immediately after the back facet monitor, data and coding scheme dependent wandering of the average level is avoided. If the coding scheme utilized does not have a true 50 percent effective duty cycle where one is guaranteed a transition in data and between bits, any variations that would otherwise be caused in laser bias control due to variations away from 50 percent duty cycle are avoided.

The midpoint voltage on the line 44 is provided to the laser bias control block 46, where it is compared to a threshold signal on a line 48 which may be adjustable, as indicated by a threshold adjust block 50. The threshold is chosen to place the laser at a selected average optical output power level, such as the $P_0$ level shown in FIG. 1. If the midpoint voltage is below the threshold, then the laser bias control block provides a signal on a line 52 to increase the bias current in the laser driver block 20 until the midpoint voltage equals the threshold. An opposite effect occurs if the midpoint voltage is above threshold.

In the difference detector 42, the difference between the peak and valley voltages on the lines 38a, 38b, respectively, is determined. A difference voltage signal is provided on a line 54 to a laser modulation control block 56, where it is compared to a threshold signal on a line 58 provided by a threshold adjust block 60 which may be capable of adjusting the level of the threshold reference signal on the line 58. The threshold is set according to the desired modulation index or ratio of signal-power-to-average-power out of the laser of the digital signal. If the difference voltage is below threshold, then the laser modulation control block provides a signal on a line 62 to increase the gain of the signal in the laser driver 20. An opposite effect occurs if the difference voltage is above threshold. In the driver, both the digital and analog signals are adjusted proportionately, so that the relative modulation indices set up for the two signal types is maintained.

Figure 3:
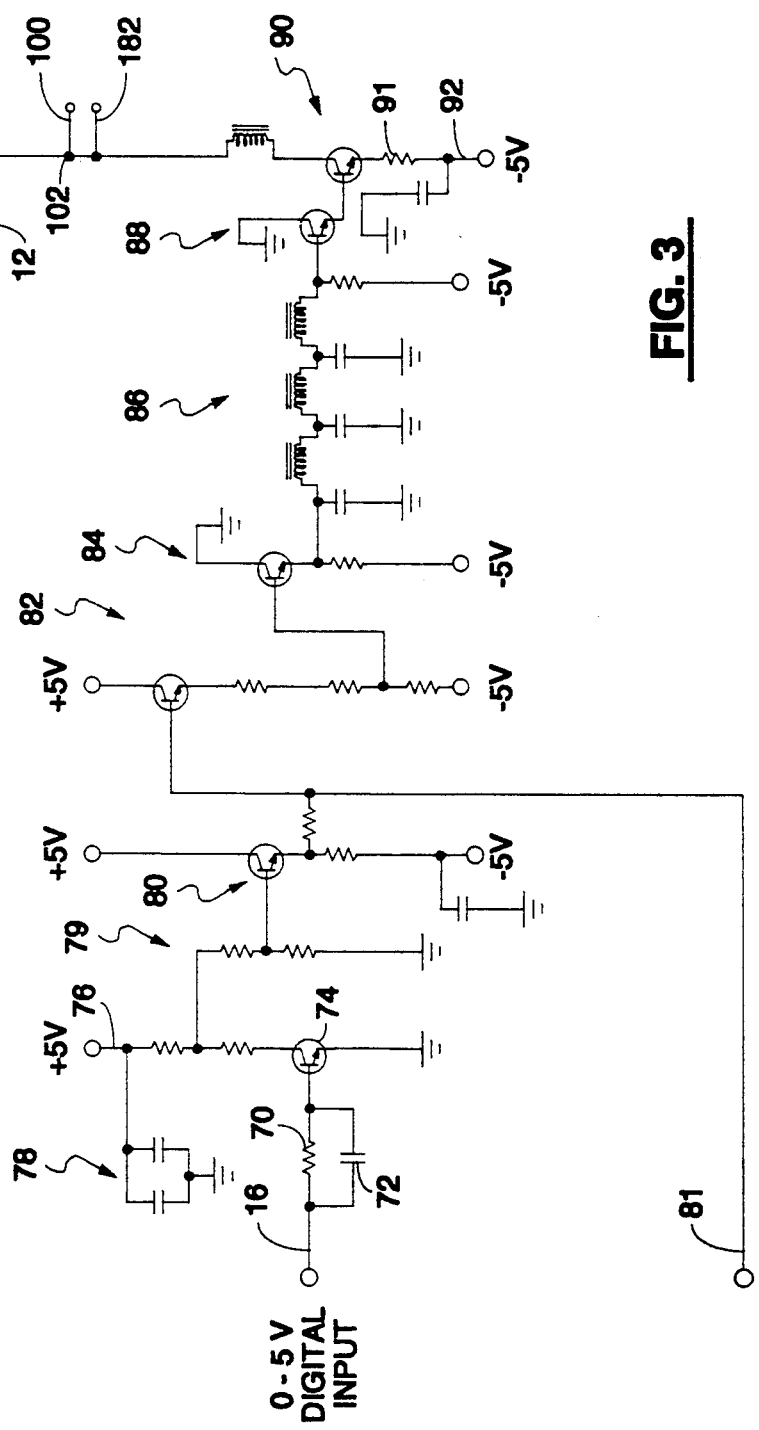
FIG. 3 is an illustration of an embodiment of the laser driver of FIGS. 2(a) and 2(b) for handling the digital data signal.

Turning now to FIG. 3, a detailed illustration is shown of one way to construct a portion of the laser driver 20 of FIGS. 2(a) and 2(b) for handling the relatively low-speed digital data input signal on the line 16. That signal is first terminated by a resistor 70 and capacitor 72 in parallel, which helps with proper switching of a transistor 74 to prevent pulsewidth distortion. The transistor 74 is sourced by a VCC voltage at a node 76 at +5V. The collector voltage is filtered by a capacitor pair 78 in parallel, and a series of resistors 79 is employed for the purpose of level conversion before being buffered by a buffer stage 80, which also serves to convert the driving signal to a driving signal having negative excursions. This was done for the particular embodiment shown because of the particular laser selected, which needs to be driven negatively. This, of course, need not be the case.

An emitter follower section 82 follows the buffer stage 80 and further level converts the input to get closer to a negative 5V suited to the particular laser diode 12 we selected. A buffer section 84 buffers the output of the emitter follower section 82 and is itself followed by a lowpass filter section 86 which passes signals, for example in the range of 0–20 MHz. This is not the same as the lowpass filter 28 shown in FIGS. 2(a) and 2(b) but is merely provided to eliminate higher frequency components from the digital signal which would otherwise cause distortions in the analog video signal, to be multiplexed with the digital at node 102.

The lowpass filter 86 is followed by a further conversion section 88 which places the most negative excursion of the filtered signal almost down to −5V so that a minimal DC current will be provided by this section.

For given signal excursion or swing at the base of transistor 90, the resistor 91 sets the modulation current for the digital signal in the laser 12.

The light output 24 from the laser diode 12 is detected by the back facet 26 thereof, and the detected signal is provided on the line 30, as described above in connection with FIGS. 2(a) and 2(b). Although a lowpass filter 28 is shown in FIGS. 2(a) and 2(b), for the particular case illustrated, it was found not necessary to include such a lowpass filter, since the capacitance of the diode itself plus the input resistance of the transistor 154 circuit was sufficiently great to provide an effective lowpass filter, in this particular case.

Figure 4:
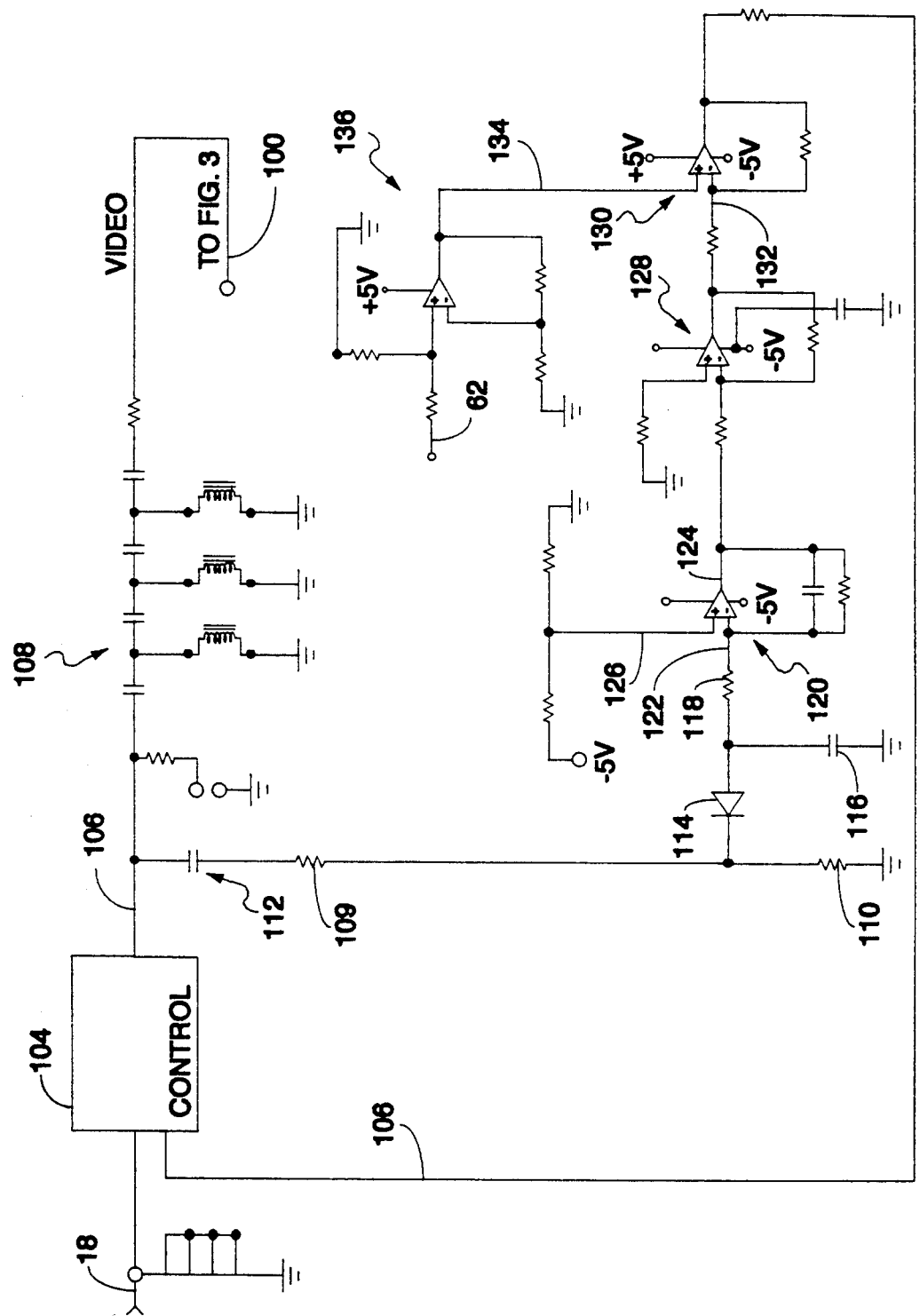
FIG. 4 is an illustration of an embodiment of the laser driver of FIG. 2 for handling the high-speed signals.

In connection with the description of FIG. 4 below, it will be seen that the output thereof is provided on a line 100 to a summing node 102 shown in FIG. 3, where the output of the video circuit of FIG. 4 is summed with the current contributed by the digital portion illustrated in FIG. 3. This effectively forms a frequency-division multiplexing node for multiplexing the low-frequency digital signals with the high-frequency video signals. The multiplexed signal thus modulates the diode 12.

Turning now to FIG. 4, an illustration is shown of video circuitry for a laser driver 20 embodiment, according to present invention. The high-speed RF signals 18 of FIGS. 2(a) and 2(b) are shown at the upper left of FIG. 4 as an input signal to a voltage controlled attenuator 104 to keep the video level at a constant level as controlled by a signal on a line 106, which is in turn controlled by the feedback signal on the line 62 shown in both. FIGS. 2(a) and 2(b) and FIG. 4 (from the laser modulation control 56 to be disclosed in more detail below in connection with FIGS. 5(a) and 5(b).

An output signal on a line 106 from the voltage controlled attenuator 104 is filtered by a highpass filter 108 for getting rid of any low frequency components that might otherwise corrupt the digital signals to be joined with the video signals on the line 100, as shown summed at the junction 102 in FIG. 3.

The signal on the line 106 is also provided to a series of resistors 109, 110 and a capacitor 112, which together serve the purpose of presenting an impedance which prevents any influence of the control circuitry on the video signal path 106. In other words, resistors 109, 110 and the capacitor 112 have values selected such that the impedance presented to the main line 106 is greater than ten times the characteristic impedance of the main line 106. A diode 114 (configured as a back diode to minimize temperature drift effects) and capacitor 116 serve the purpose of doing average power detection. The capacitor 116 also acts in concert with a resistor 118 as a pre-integrator to prevent instantaneous high peaks from being presented to an integrator 120 which integrates a signal on a line 122, to provide an integrated output signal on a line 124. The integrator is with reference to a reference signal on a line 126, whereby the integrator 120 tries to zero the difference between the signal on the line 122 and the signal on the line 126. After the integrator 120, stages 128, 130 perform both gain and level shifting by moving the DC swing of a signal on line 132 into a range that the voltage-controlled attenuator 104 needs as a control voltage, i.e., between 0 and −5V.

Figure 5:
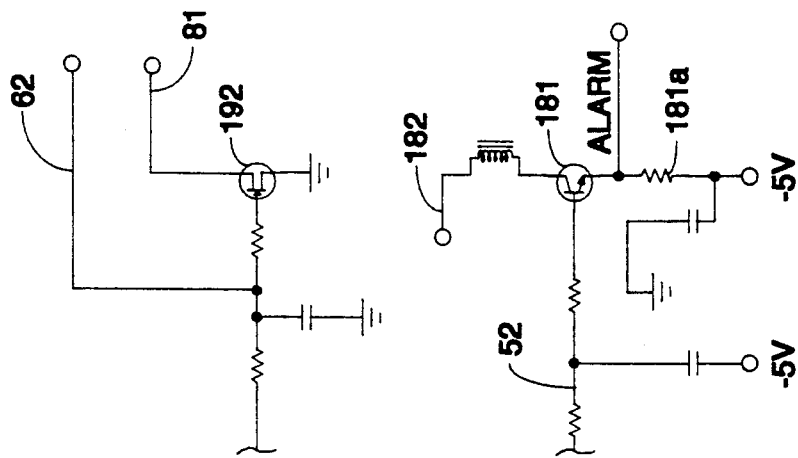
FIG. 5 shows the relation between FIGS. 5(a) and 5(b).
Figure 2:
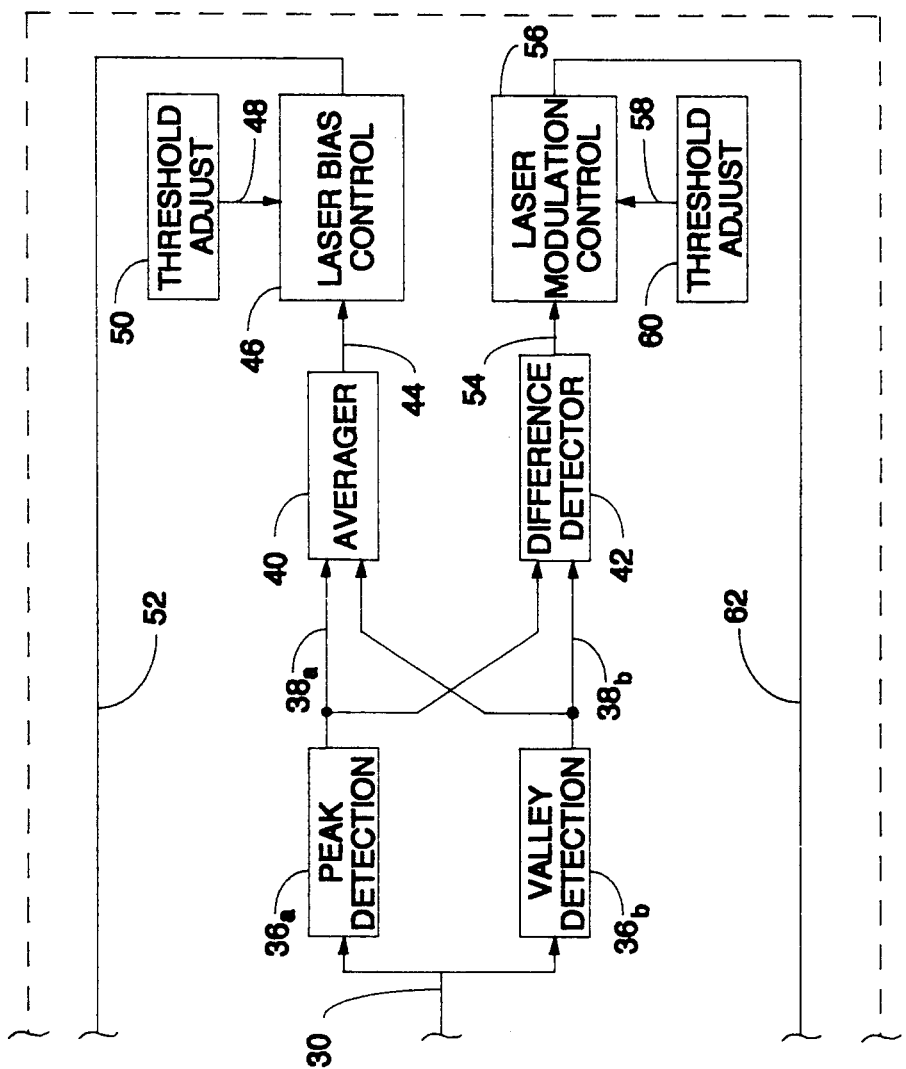
FIG. 2 shows the relation between FIGS. 2(a) and 2(b).
Figure 5A:
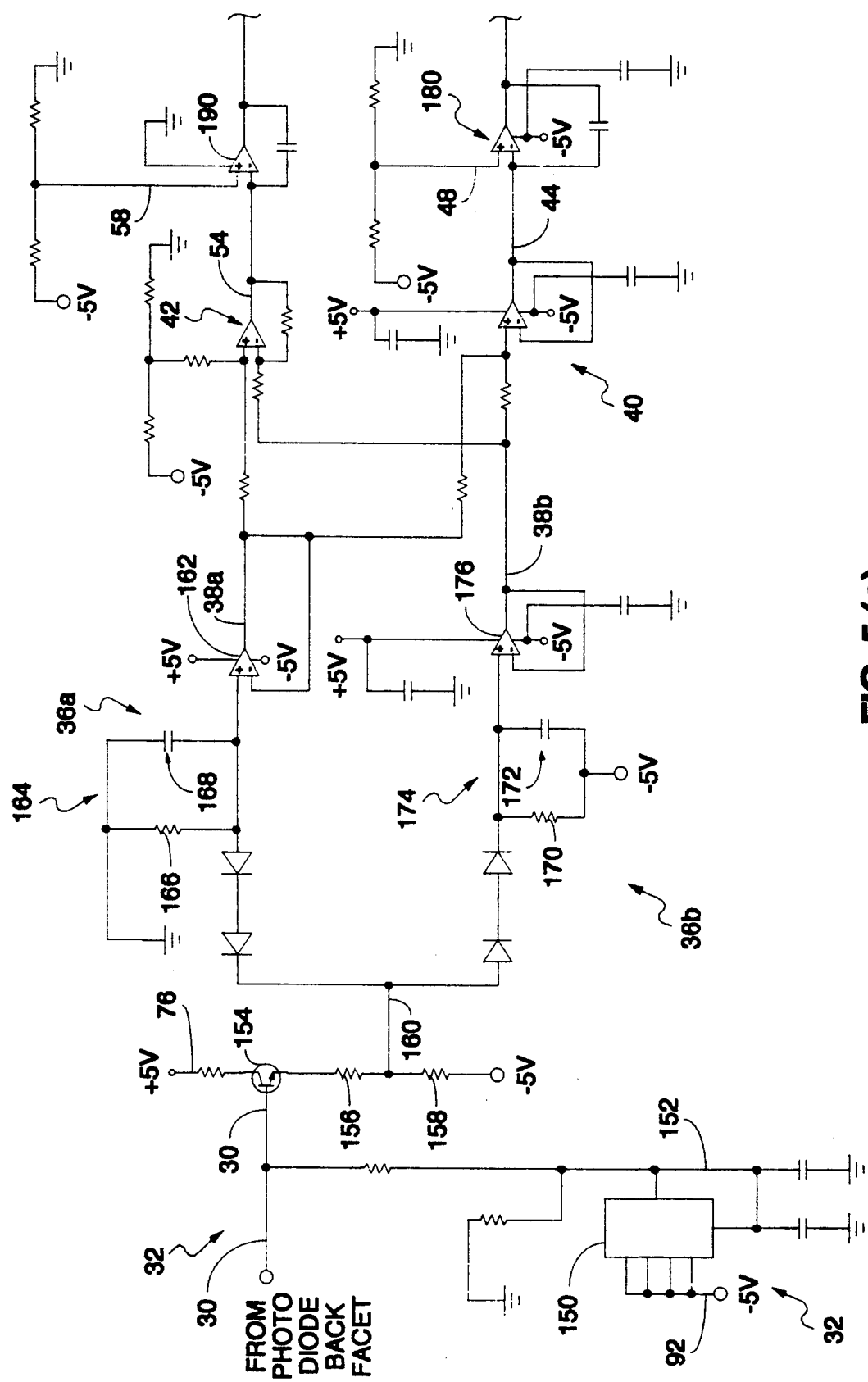

The differential amplifier stage 130 drives the difference between the input signal on the line 132 and an input signal on a line 134 to zero The signal on the line 134 is provided by a signal conditioning stage 136 response to the feedback signal on the line 62 from FIGS. 5(a) and 5(b).

FIGS. 5(a) and 5(b) shows the laser bias and AGC control part of FIGS. 2(a) and 2(b). A voltage regulator 150 is responsive to the −5V on line 92 for providing a regulated a −2.5V on a line 152. At equilibrium, the voltage on the line 34 sits at −1.25V, and the amount of swing is determined by the way the modulation index is set up.

A transistor 154 is responsive at its collector to the +5V on the line 76 and provides a current through a pair of resistors 156, 158, which have a connecting node 160 which, at equilibrium, sits at −2.5V. The peak detector 36a and valley detector 36b of FIGS. 2(a) and 2(b) are shown in one embodiment in FIG. 5(a) and 5(b). A buffer operational amplifier 162 provides the captured peak signal on the line 38a, which is held by a circuit 164 having a resistor 166 and a capacitor 168 with values chosen so as to have a time constant longer than the longest expected time between transitions of the digital input signal, which may be unbalanced in the sense of not having a 50 percent duty cycle. Thus, for a case where the longest time between transitions is on the order of 180 nanoseconds, the resistive value may be chosen to be 162 Kohm, while the capacitor may be about 33 picofarad. Similar values can be chosen for a resistor 170 and a capacitor 172 in a circuit 174 having a purpose of holding the peak or valley of the signal on the line 160. An operational amplifier 176 provides the valley signal on the line 38b to the averager 40, which is responsive to both the signal on the line 38b and to the signal on the line 38a for finding the midpoint. A differential amplifier 180 compares the reference signal on the line 48 to the average signal on the line 44, as previously discussed in connection with FIGS. 2(a) and 2(b). The output of the differential amplifier 180 is the signal on the line 52 shown in FIGS. 2(a) and 2(b) as a feedback signal for the laser driver. This signal is used to drive a transistor 181. For a given signal voltage at the base of transistor 181, a DC or bias current is set by resistor 181a and is then summed through line 182 at node 102 with the video and digital modulation currents passing through the laser diode 12.

The signal on the line 38a is a signal representing the latest peak value of the input signal. It is provided not only to the voltage follower 40 of the average detector, but also the difference detector 42 which is responsive also to the signal on the line 38b for providing the difference signal on the line 54 to a comparator 190, which compares the difference signal on the line 54 to the reference signal on the line 58 and provides the feedback signal on the line 62 to the video portion of the laser driver, as shown in FIG. 4. The signal on the line 62 is also used at the gate of an FET 192 used as a voltage-controlled resistor in the digital portion of the laser driver circuit of FIG. 3. The signal changes the resistance of the FET in accordance with changes in the difference in the peak and valley, therefore changing the voltage division ration of the digital signal after transistor 80 in FIG. 3.

Although the invention has been shown and described with respect to a best mode embodiment thereof, it should be understood by those skilled in the art that the foregoing and various other changes, omissions and additional in the form and detail thereof may be made therein without departing from the spirit and scope of the invention.

What is claimed is:

1. A method for maintaining constant light output for varying efficiencies and operating points of a laser diode modulated by a modulating signal, comprising the steps of:
   sensing the light output and providing a sensed signal having a magnitude indicative thereof;
   providing, in response to the sensed signal, a bias current feedback control signal for controlling a bias current provided to the laser diode; and
   providing, in response to the sensed signal, a modulation current amplitude feedback control signal for controlling the modulation current amplitude used to modulate the bias current.

2. The method of claim 1, wherein the varying efficiencies are due to varying temperatures.

3. The method of claim 1, wherein the varying operating points are due to variations in duty cycle of the modulating signal at least partly in digital form.

4. The method of claim 1, wherein the bias current feedback control signal is provided according to a midpoint of peaks of the sensed signal.

5. The method of claim 1, wherein the modulation current amplitude feedback control signal is provided according to a difference in magnitudes between peaks of the sensed signal.

6. The method of claim 1, wherein the modulating signal comprises a relatively low-speed digital data signal frequency-division multiplexed with one or more relatively high-speed signals.

7. The method of claim 6, wherein the high-speed signals are analog video signals.

8. Apparatus for maintaining constant light output for varying efficiencies and operating points of a laser diode modulated by a modulating signal, comprising:
   means responsive to the light output for providing a sensed signal having a magnitude indicative thereof;
   means for providing, in response to the sensed signal, a bias current feedback control signal for controlling a bias current provided to the laser diode;
   means for providing, in response to the sensed signal, a modulation current amplitude feedback control signal for controlling the modulation current amplitude used to modulate the bias current; and
   laser driver means, responsive to the bias current feedback control signal and the modulation current amplitude feedback control signal and to the modulating signal for providing the constant light output.

9. The apparatus of claim 8, wherein the varying efficiencies are due to varying temperatures.

10. The apparatus of claim 8, wherein the varying operating points are due to variations in duty cycle of the modulating signal at least partly in digital form.

11. The apparatus of claim 8, wherein the bias current feedback control signal is provided according to a midpoint of peaks of the sensed signal.

12. The apparatus of claim 8, wherein the modulation current amplitude feedback control signal is provided according to a difference in magnitude between peaks of the sensed signal.

13. The apparatus of claim 8, wherein the modulating signal comprises a relatively low-speed digital data signal frequency-division multiplexed with one or more relatively high-speed signals.

14. The apparatus of claim 13, wherein the high-speed signals are analog video signals.

15. Apparatus, comprising:
   a laser diode driver (20), responsive to a low-speed digital data signal (16), a high-speed RF signal (18), a bias feedback signal (52) and a modulation feedback signal (62), for providing a driving signal (102);
   a laser diode (12), responsive to the driving signal (102), for providing a constant light output signal (22) and a monitoring light output signal (24);
   a back facet monitor diode (26), responsive to the monitoring light output signal (24), for providing a sensed signal (30);
   peak detection means (36a), responsive to the sensed signal (30), for providing a peak signal (38a) having a magnitude indicative of a positive peak amplitude of the sensed signal;
   valley detection means, responsive to the sensed signal (30), for providing a valley signal (38b) having a magnitude indicative of a negative peak amplitude of the sensed signal;
   averager means (40), responsive to the peak and valley signals (38a, 38b), for providing a midpoint signal (44) having a magnitude indicative of a midpoint between the positive and negative peak signals;
   difference detector means (42), responsive to the peak and valley signals (38a, 38b), for providing a difference signal (54) having a magnitude indicative of a difference between the positive and negative peak signals;
   laser bias control means (46), responsive to the midpoint signal (44) and to a bias reference signal (48), for providing the bias feedback signal (52); and
   laser modulation control (56), responsive to the difference signal (54) and to a modulation reference signal (58), for providing the modulation feedback signal (62).

16. The apparatus of claim 15, further comprising current-to-voltage level conversion means (32), responsive to the sensed signal (30), for providing the sensed signal (30) in converted form.

17. The apparatus of claim 15, further comprising lowpass filter means, responsive to the sensed signal (30) for providing a low-pass filtered sensed signal (30).

* * * * *